(12) United States Patent
Lundberg

(10) Patent No.: US 9,793,894 B1
(45) Date of Patent: Oct. 17, 2017

(54) DATA SYNCHRONIZER FOR REGISTERING A DATA SIGNAL INTO A CLOCK DOMAIN

(71) Applicant: VIA ALLIANCE SEMICONDUCTOR CO., LTD., Shanghai (CN)

(72) Inventor: James R. Lundberg, Austin, TX (US)

(73) Assignee: VIA ALLIANCE SEMICONDUCTOR CO., LTD., Shanghai (CN)

( * ) Notice: Subject to any disclaimer, the term of this patent is extended or adjusted under 35 U.S.C. 154(b) by 0 days.

(21) Appl. No.: 15/356,163

(22) Filed: Nov. 18, 2016

(51) Int. Cl.
*H03K 19/00* (2006.01)
*H03K 19/003* (2006.01)
*H03K 19/20* (2006.01)
*H01L 27/088* (2006.01)

(52) U.S. Cl.
CPC ... *H03K 19/00315* (2013.01); *H01L 27/0886* (2013.01); *H03K 19/20* (2013.01)

(58) Field of Classification Search
None
See application file for complete search history.

(56) References Cited

U.S. PATENT DOCUMENTS

| | | | |
|---|---|---|---|
| 4,948,954 A | 8/1990 | Dias | |
| 5,045,675 A | 9/1991 | Curry | |
| 5,138,189 A | 8/1992 | Leung et al. | |
| 5,336,939 A * | 8/1994 | Eitrheim | G06F 1/10 327/114 |
| 5,359,232 A * | 10/1994 | Eitrheim | G06F 1/10 327/116 |
| 5,424,654 A * | 6/1995 | Kaplinsky | H03K 3/0372 326/40 |
| 5,553,276 A | 9/1996 | Dean | |
| 5,589,782 A | 12/1996 | Sharpe-Geisler | |
| 5,781,765 A | 7/1998 | Alexander | |
| 7,285,981 B2 * | 10/2007 | Madurawe | H03K 19/177 326/38 |
| 7,635,989 B1 * | 12/2009 | Young | G06F 15/7867 326/39 |
| 7,659,762 B2 | 2/2010 | Schuelein | |

(Continued)

OTHER PUBLICATIONS

Kumar et al. Metastability, MTBF, Synchronizer & Synchronizer Failure. http://www.slideshare.net/prashantsingh94651/mtbf. Apr. 21, 2013. pp. 1-18.

*Primary Examiner* — Crystal L Hammond
(74) *Attorney, Agent, or Firm* — Gary Stanford; James W. Huffman

(57) ABSTRACT

A data synchronizer that registers an input data signal into a clock domain of a clock signal. The data synchronizer includes in input circuit, first and second pass gates, first and second inverters, gate controller, and a register. The input circuit drives first and second data nodes to opposite logic states based on the input data signal. Each pass gate is coupled between a data node and a capture node. The inverters are cross-coupled between the capture nodes. The gate controller is capable of keeping the pass gates at least partially open during a metastable condition of the capture nodes, and closes the pass gates when the capture nodes resolve to opposite logic states. The register registers a capture node to provide a registered data output in response to the clock signal. The data synchronizer may be implemented using FinFET devices.

21 Claims, 3 Drawing Sheets

(56) References Cited

U.S. PATENT DOCUMENTS

| | | | |
|---|---|---|---|
| 7,983,099 B2* | 7/2011 | Kim | G11C 5/14 |
| | | | 365/191 |
| 8,258,864 B1* | 9/2012 | Chan | H03F 3/45183 |
| | | | 330/260 |
| 8,301,943 B2* | 10/2012 | Klass | G01R 31/318541 |
| | | | 714/726 |
| 9,281,807 B1* | 3/2016 | Maillard | H03K 3/356156 |
| 2004/0119505 A1 | 6/2004 | Ryan | |
| 2004/0239393 A1 | 12/2004 | Anshumali et al. | |
| 2005/0193051 A1* | 9/2005 | Katakura | G06F 7/026 |
| | | | 708/670 |
| 2013/0135017 A1* | 5/2013 | Jones | H03K 3/356173 |
| | | | 327/142 |
| 2013/0188428 A1 | 7/2013 | Ma | |

* cited by examiner

US 9,793,894 B1

DATA SYNCHRONIZER FOR REGISTERING A DATA SIGNAL INTO A CLOCK DOMAIN

CROSS REFERENCE TO RELATED APPLICATION(S)

This application is related to the following U.S. Patent Application which is filed concurrently herewith and which is hereby incorporated by reference in its entirety for all intents and purposes.

| SERIAL NUMBER | FILING DATE | TITLE |
| --- | --- | --- |
| 15/356,193 | Nov. 18, 2016 | DATA SYNCHRONIZER FOR LATCHING AN ASYNCHRONOUS DATA SIGNAL RELATIVE TO A CLOCK SIGNAL |
| 15/356,214 | Nov. 18, 2016 | SCANNABLE DATA SYNCHRONIZER |

BACKGROUND OF THE INVENTION

Field of the Invention

The present invention relates in general to registering a data signal into a clock domain, and more particularly to a data synchronizer that delays a capture clock of a latch in the presence of metastability, and then captures and registers the data signal synchronous with a clock signal.

Description of the Related Art

Metastability in a digital system is an undesired condition in which a digital or binary signal temporarily assumes an incorrect or invalid state potentially causing malfunction or circuit failure. A binary signal within a digital system has an invalid state while its signal level (voltage or current) is neither high nor low but in an intermediate voltage range rendering its logic state indeterminate. Metastability may result when there is clock skew or whenever setup and hold time violations occur. A flip-flop may be used to register a data signal into a clock domain. If the data signal is generated from a different clock domain or is an asynchronous signal, then the data signal may change state in violation of the setup and hold time of the flip-flop, such as at or near an operative edge of the clock signal driving the flip-flop. In the event of such a timing violation, the flip-flop may enter a metastable state in which it temporarily enters an incorrect or even invalid state before settling to the correct state.

One conventional solution is to pass the data signal through two registers coupled in series, in which the second register is provided to clean up the signal from the first. The faster the system is operated, however, the more likely that the second register will eventually fail or otherwise register an incorrect value. Another conventional approach is to simply add additional registers in series to further reduce the probability of failure. This approach may be undesirable in many digital circuits because it adds significant latency thus reducing performance.

Another conventional solution relied upon the ability to adjust the relative size or ratio of the drive strength of individual transistors to detect metastability. Newer technologies, such as quantized FinFET technology, deliver improved levels of scalability and performance at the expense of reduced ability to adjust individual transistor size and drive strength. The techniques employed in the conventional solutions do not guarantee proper operation under all operating conditions using any type of technology including the newer FinFET technologies and the like.

SUMMARY OF THE INVENTION

A data synchronizer according to one embodiment registers an input data signal into a clock domain of a clock signal to provide a corresponding registered data signal that is synchronous with the clock signal. The data synchronizer includes an input circuit, first and second pass gates, first and second inverters, a gate controller, and a register. The input circuit receives the input data signal and drives first and second data nodes to opposite logic states. Each pass gate is coupled between one of the data nodes and one of two capture nodes and has positive and negative control terminals controlled by the gate controller. The inverters are cross-coupled between the capture nodes. The gate controller is capable of keeping the pass gates at least partially open during a metastable condition of the capture nodes, and then closes the pass gates when the capture nodes resolve to opposite logic states. The register registers at least one of the capture nodes to provide a registered data output in response to the clock signal. The data synchronizer may be implemented using FinFET devices. The capture nodes may be loaded in a substantially balanced manner.

Each pass gate may include a P-channel device and an N-channel device having current terminals coupled in parallel, in which each device has a control terminal coupled to the gate controller. The gate controller may include a first logic gate and a second logic gate, each controlled by the clock signal or versions thereof. The first logic gate may be an AND-OR-Invert gate and the second logic gate may be an OR-AND-Invert gate. The AND-OR-Invert gate may control the P-channel device of each pass gate, and the OR-AND-Invert gate may control the N-channel device of each pass gate.

The gate controller may be capable of keeping the P-channel devices of the pass gates at least partially on when one of the capture nodes is within a logic high voltage range while the other capture node is in an intermediate voltage range between the logic high voltage range and a logic low voltage range. The gate controller may be capable of keeping the P-channel devices at least partially on when an average voltage of the capture nodes is at least a middle voltage level of a full logic voltage range and neither is within the logic low voltage range.

The gate controller may be capable of keeping the N-channel devices of the pass gates at least partially on when one of the capture nodes is within the logic low voltage range while the other capture node is in an intermediate voltage range between the high and low logic voltage ranges. The gate controller may be capable of keeping the N-channel devices at least partially on when an average voltage of the capture nodes is no more than a middle voltage level of a full logic voltage range and neither is within the logic high voltage range.

A method of synchronizing an input data signal with a clock signal according to one embodiment includes providing first and second data signals that transition to opposite logic states in response to transitions of the input data signal, passing the first data signal through a first pass gate to a first capture node, passing the second data signal through a second pass gate to a second capture node, keeping the first and second pass gates at least partially open during a metastable condition of the first and second capture nodes, closing the first and second pass gates to latch the capture nodes when the first and second capture nodes settle to opposite logic states in response to an operative transition of the clock signal for latching the first and second capture nodes, and registering at least one of the first and second capture nodes in response to the clock signal to provide a registered data signal that is synchronous with the clock signal.

The method may include keeping the first and second pass gates at least partially open when the first and second capture nodes are at the same logic state or when at least one of the first and second capture nodes is in an intermediate voltage range rendering its logic state indeterminate.

The method may include providing a positive gate signal that controls a P-channel device of each of the first and second pass gates to remain at least partially on when the first and second capture nodes are at a logic high state or when at least one of the first and second capture nodes is in an intermediate voltage range and neither is at a low logic state. The method may include providing a positive gate signal that controls a P-channel device of each of the first and second pass gates to remain at least partially on when an average voltage of the first and second capture nodes is at least a middle voltage level of a full logic voltage range and neither is in a low logic state.

The method may include providing a negative gate signal that controls an N-channel device of each of the first and second pass gates to remain at least partially on when the first and second capture nodes are at a logic low state or when at least one of the first and second capture nodes is in an intermediate voltage range and neither is at a high logic state. The method may include providing a negative gate signal that controls an N-channel device of each of the first and second pass gates to remain at least partially on when an average voltage of the first and second capture nodes is no more than a middle voltage level of a full logic voltage range and neither is in a high logic state. The method may include loading the first and second capture nodes in a substantially balanced manner.

BRIEF DESCRIPTION OF THE DRAWINGS

The benefits, features, and advantages of the present invention will become better understood with regard to the following description, and accompanying drawings where.

DETAILED DESCRIPTION

The inventor has recognized the need for a more reliable method of latching an asynchronous data signal relative to a clock signal, and then registering the data signal into a clock domain. He has therefore developed a data synchronizer that delays latching the data signal while a metastable condition exists, and then that latches the data signal when metastability is resolved so that the data signal can be successfully registered into the clock domain. The data signal may be provided from a different clock domain or may be a true asynchronous signal. A gate controller detects the metastable condition and holds pass circuitry at least partially open until the metastable condition is resolved, at which time the data signal is latched so that it can be successfully registered into the clock domain. A significant benefit of a data synchronizer as described herein is that it may be implemented using any type of manufacturing technology, including the newer quantized FinFET manufacturing technology. A data synchronizer as described herein does not rely on the ability to adjust relative size or drive strength of individual transistors for detecting the metastable condition.

Figure 1:
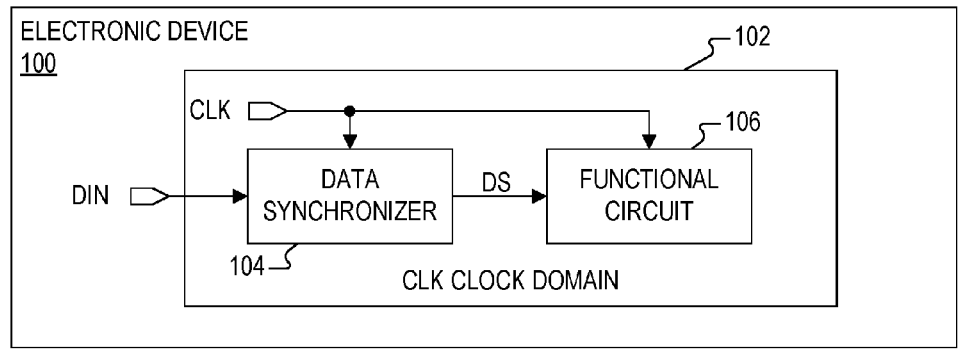
FIG. 1 is a simplified block diagram of an electronic device incorporating a data synchronizer implemented according to an embodiment of the present invention.

FIG. 1 is a simplified block diagram of an electronic device 100 incorporating a data synchronizer 104 implemented according to an embodiment of the present invention. The electronic device 100 includes an electronic circuit 102 that further includes digital circuitry operating in a clock domain using a clock signal CLK, meaning that any binary or digital signals of the electronic circuit 102 are generally synchronized with CLK. The electronic circuit 102 includes, for example, a functional circuit 106 that receives CLK and operates in the CLK clock domain. A data input signal DIN is provided to the data synchronizer 104 provided within the electronic circuit 102, which also receives CLK and which converts the DIN signal to a data signal DS that is synchronous with CLK. DS is provided to the functional circuit 106 so that it can successfully and correctly detect the state and state transitions of DIN via the DS signal.

The DIN signal may be provided by any one of a variety of sources. The electronic device 100 may have additional circuitry (not shown) operative in a clock domain that is different from the CLK clock domain, in which DIN may be sourced from any such circuitry operative in at least one different clock domain. Alternatively, DIN may be an asynchronous signal generated by another circuit located on the electronic device 100 (not shown) or generated from an external source outside the electronic device 100. The term "asynchronous" as used herein means that DIN is not synchronous with the CLK clock domain, which includes different and incompatible clock domains and/or truly asynchronous sources. In this respect, the DIN signal is asynchronous relative to the CLK clock domain such that if directly provided to the functional circuit 106 without synchronization, a transition of the DIN signal eventually violates the setup and hold times of the receiving circuitry causing metastability of at least one signal within the functional circuit 106.

Metastability in a digital system is an undesired condition in which a digital signal temporarily assumes an incorrect or invalid state. For example, a digital signal may have two normal logic states based on its voltage level, in which a first logic state is determined when the signal voltage is at or below a logic low voltage threshold and a second logic state is determined when the signal voltage is at or above a logic high voltage threshold. A logic high voltage range is defined as the signal voltage being at or above the logic high voltage threshold, and a logic low voltage range is defined as the signal voltage being at or below the logic low voltage threshold. The logic state may be indeterminate when the signal voltage is between the logic low and high voltage thresholds. Even though the signal voltage may eventually settle to the correct voltage level, it may not do so within a specified period of time causing an incorrect result. Metastability in the digital circuitry of the functional circuit 106 is not desirable and may cause malfunction or even failure of the functional circuit 106, which likely causes similar malfunction or even failure of the electronic device 100 itself. The data synchronizer 104 is provided to synchronize DIN with CLK to avoid metastability.

The electronic device 100 may be an integrated circuit (IC) fabricated to perform one or more desired functions or operations. In one embodiment, the electronic device 100 is a "processor" or "processing device" or the like, which refers to any type of processing unit, including a microprocessor, a central processing unit (CPU), a processing core, a microcontroller, etc. The term "processor" and variations may also refer to any type of processor configuration, such as processing units integrated on a chip or integrated circuit (IC) including those incorporated within a system on a chip (SOC) or the like. Alternatively, the electronic device 100 may be a system device including any type of electronic circuit incorporating digital circuitry. For example, the electronic device 100 may be any type of computer or computing device, such as a computer system (e.g., notebook computer, desktop computer, netbook computer, etc.), a media tablet device (e.g., iPad by Apple Inc., Kindle by Amazon.com, Inc., etc.), a communication device (e.g., cellular phone, smartphone, etc.), among other types of electronic devices (e.g., media player, recording device, etc.). In a system configuration, the electronic circuitry 102 may be any type of integrated or discrete subsystem module including any type of peripheral or processing system. In general, the data synchronizer 104 is used to successfully capture an external data signal for use within digital circuitry operative within a clock domain, such as the CLK clock domain.

The electronic device 100, or at least the electronic circuit 102 and/or the data synchronizer 104, may be implemented using any type of technology, including CMOS technology and its variations. CMOS technology variations include the conventional planar technology and the newer, non-planar technology such as FinFET devices. In one embodiment, the data synchronizer 104 is implemented using 16 nanometer (nm) FinFET devices. FinFET devices provide improved scalability while keeping transistor strength, reducing leakage, and providing improved tolerance to electronic fields (E-fields). FinFET devices are much smaller so that they consume less area, while they also have a strength that is better than or equal to the previous technology generation, such as planar technology. FinFETs can operate at relatively high voltage with higher reliability and with lower leakage as compared to planar technology. Planar technology exhibited huge current leakage and reliability issues with reduced size.

The size of individual transistors implemented with conventional planar technology could be adjusted (via length and/or width) as desired providing somewhat greater drive strength flexibility. FinFETs, on the other hand, are typically implemented with singular size and quantized drive strengths. Rather than adjusting size and/or drive strength, each FinFET has the same size so that drive strength is adjusted by the adjusting number of FinFETs coupled in parallel. For instance, if one FinFET is not strong enough, then a second FinFET is coupled in parallel in order to double the strength. In this manner, if the strength needed is 1.5 times that of a single device, then two devices to achieve twice the strength is the only option since there are no intermediate sizes. Conventional solutions for synchronizing data that relied upon size adjustment could not guarantee proper operation under all operating conditions and technologies including FinFET technology.

Figure 2:
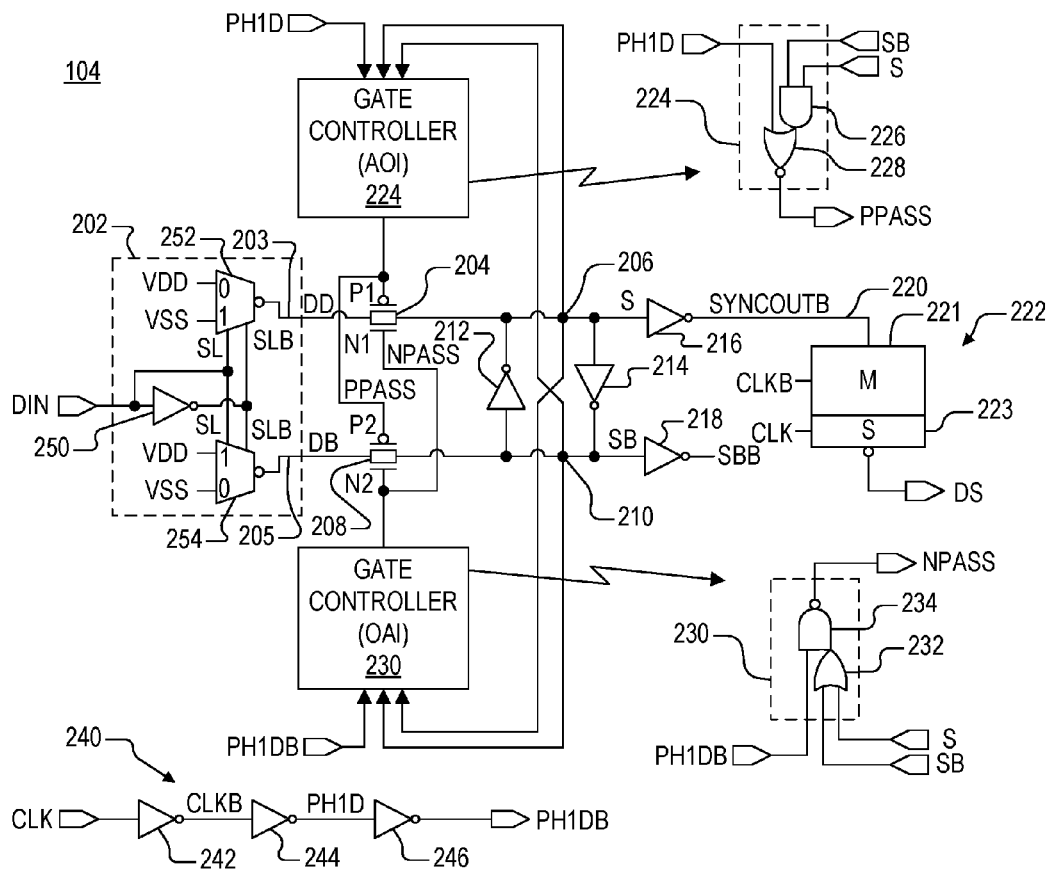
FIG. 2 is a schematic diagram of the data synchronizer of FIG. 1 implemented according to one embodiment of the present invention for synchronizing a data input signal DIN to provide the DS data signal synchronized with CLK.

FIG. 2 is a schematic diagram of the data synchronizer 104 implemented according to one embodiment of the present invention for synchronizing DIN to provide the DS data signal synchronized with CLK. DIN is provided to an input circuit 202 which converts DIN to a buffered data signal DD on a node 203 and a buffered and inverted data signal DB on a node 205. DD is a buffered version of DIN in which it follows the state of DIN after a slight delay through the input circuit 202, and DB is a buffered and inverted version of DIN in which it follows the opposite state (or inverted state) of DIN after a slight delay through the input circuit 202. The input circuit 202 operates to transition DD and DB at substantially the same time in response to a transition of DIN as further described herein.

DD is provided through a pass gate 204 to a first capture node 206 developing a signal S, and DB is provided through a second pass gate 208 to a second capture node 210 developing a signal SB. A pair of cross-coupled inverters 212 and 214 are coupled between the nodes 206 and 210. In particular, the inverter 212 has its input coupled to node 210 and its output coupled to node 206, and the inverter 214 has its input coupled to node 206 and its output coupled to node 210. Another inverter 216 has its input coupled to node 206 and its output coupled to a node 220 developing an inverted synchronous output signal SYNCOUTB. SYNCOUTB on node 220 is provided to an input of a register 222, having its output providing the DS signal. The register 222 may be positioned at any location in the circuit, near or far, so long as the inverter 216 provides sufficient drive capacity to drive the input of the register 222 given the frequency of CLK. The register 222 is configured as a master-slave including a master latch 221 receiving and operative with an inverted version of CLK shown as CLKB, and a slave latch 223 receiving and operative with the clock signal CLK. The register 222 inverts its output, so that DS is a registered and inverted version of SYNCOUTB. Another inverter 218 has its input coupled to node 210 and its output developing a signal SBB.

In one embodiment, the inverters 216 and 218 provide substantially balanced capacitive loading of S and SB to provide SYNCHOUTB and SBB, respectively. Although the SBB signal is not used in the illustrated configuration, the SBB signal may be registered instead or in the alternative. The inverters 216 and 218 may be replaced with any other type of buffer or buffering device or buffering logic configuration, which may also provide substantially balanced loading of S and SB. Either SYNCOUTB or SBB or both may be used to provide latched outputs for registers, such as the register 222. For example, non-inverting buffer devices may be used, or buffering logic may have one or more synchronized logic inputs in various configurations. Load balancing between the nodes 206 and 210 is particularly advantageous to facilitate synchronizing operation between S and SB.

The pass gate 204 includes a P-channel device P1 coupled in parallel with an N-channel device N1. In particular, P1 and N1 each have a first current terminal coupled to node 203 and a second current terminal coupled to node 206. P1 has a control terminal receiving a pass control signal PPASS and N1 has a control terminal receiving a pass control signal NPASS. In a similar manner, the pass gate 208 includes a P-channel device P2 coupled in parallel with an N-channel device N2. As shown, P2 and N2 each have a first current terminal coupled to node 205 and a second current terminal coupled to node 210. P2 has a control terminal receiving the pass control signal PPASS and N2 has a control terminal receiving the pass control signal NPASS. Thus, PPASS controls P1 and P2 and NPASS controls N1 and N2. The devices P1, N1, P2 and N2 may be implemented as FET or MOS type transistor devices including FinFET devices, in which the current terminals may be source and drain terminals and the control terminals may be gate terminals.

A first gate controller 224 is provided to provide the PPASS signal to control activation of the P-channel devices P1 and P2 of the pass gates 204 and 208, and a second gate controller 230 is provided to provide the NPASS signal to control activation of the N-channel devices N1 and N2 of the pass gates 204 and 208. Although two separate gate controllers 224 and 230 are shown, they may be considered together as a single gate controller that monitors metastability of the capture nodes 206 and 210 (developing S and SB, respectively) and that is responsive to CLK to control the activation states of the pass gates 204 and 208. The gate controller 224 is shown configured as a 3-input AND-OR-Invert (AOI) gate receiving signals S, SB, and a clock signal PH1D at its respective inputs and providing the PPASS signal at its output. The AOI gate is the logical equivalent of a 2-input AND gate 226 and a 2-input NOR gate 228, in which the inputs of the AND gate 226 receive S and SB, the output of the AND gate 226 is provided to one input of the NOR gate 228, the other input of the NOR gate 228 receives PH1D, and the output of the NOR gate 228 provides the PPASS signal. The AOI gate performs the same logic function with fewer transistors (e.g., only 6 transistors, FIG. 5) and with only a single gate delay.

Similarly, the gate controller 230 is shown configured as a 3-input OR-AND-Invert (OAI) gate receiving signals S, SB and a clock signal PH1DB at its respective inputs and providing the NPASS signal at its output. The OAI gate is the logical equivalent of a 2-input OR gate 232 and a 2-input NAND gate 234, in which the inputs of the OR gate 232 receive S and SB, the output of the OR gate 232 is provided to one input of the NAND gate 234, the other input of the NAND gate 234 receives PH1DB, and the output of the NAND gate 234 provides the NPASS signal. Likewise, the OAI gate performs the same logic function with fewer transistors (e.g., only 6 transistors, FIG. 6) and with only a single gate delay.

A clock circuit 240 is provided for developing clock signals based on CLK for controlling the data synchronizer 104. The clock circuit 240 includes a first inverter 242 having an input receiving CLK and an output providing the inverted clock signal CLKB. CLKB is provided to the input of a second inverter 244 having an output providing the clock signal PH1D provided to the gate controller 224. PH1D is provided to the input of a third inverter 246 having an output providing the inverted clock signal PH1DB provided to the clock controller 230.

The input circuit 202 includes an inverter 250 and two 2-input inverted output multiplexers (MUXes) 252 and 254. DIN is provided to the input of the inverter 250 and to the non-inverting select input SL of each of the MUXes 252 and 254. The output of the inverter 250 is coupled to the inverting select input SLB of the MUXes 252 and 254. The MUX 252 has a first input pin 1 receiving a reference supply voltage VSS and a second input pin 0 receiving a supply voltage VDD. VSS has a reference voltage level suitable for a logic low or "0" level and VDD has a supply voltage level for a logic high or "1" level. The MUX 254 is coupled in the opposite manner, having a first input pin 1 receiving VDD and a second input pin 0 receiving VSS. The outputs of the MUXes 252 and 254 are logically inverting so that the selected input is logically inverted to provide the output. The input circuit 202 is configured to transition each of DD and DB simultaneously in response to a transition of DIN. The illustrated input circuit 202 is exemplary only and may be replaced by any other type of transition synchronizing logic. As described further below in relation to FIG. 3, transition synchronizing logic is not necessary and simpler input logic may be used.

In operation of the data synchronizer 104, when DIN is high, the MUXes 252 and 254 both select their pin 1 inputs to drive DD and DB. The MUX 252 selects VSS, which is inverted to drive DD high, and the MUX 254 selects VDD, which is inverted to drive DB low. When DIN is low, the MUX 252 selects VDD and inverts its output to drive DD low, and the MUX 254 selects VSS and inverts its output to drive DB high. When DIN transitions from one state to the other (e.g., from low to high or from high to low), then after a delay through the input circuit 202, DD and DB transition at about the same time to opposite states. It is noted that depending upon direction of the transition of DIN, when at or near a point of metastability, one of DD and DB (and thus one of S and SB) may transition to its correct state faster than the other. For example, when DIN transitions from low to high at or near metastability, DB may transition from high to low faster than DD transitions from low to high, and when DIN transitions from high to low at or near metastability, DD may transition from high to low faster than DB transitions from low to high.

When CLK is high, PH1D is high and PH1DB is low, which opens (or activates) both of the pass gates 204 and 208. While the pass gates 204 and 208 are completely open, nodes 203 and 206 are electrically coupled together so that S is driven to the same voltage level as DD, and nodes 205 and 210 are electrically coupled to each other so that SB is driven to the same voltage level as DB. If DIN transitions with sufficient time for S and SB to settle to opposite states while CLK is high, then when CLK next goes low, PH1D goes low and PH1DB goes high, which closes (or deactivates) both of the pass gates 204 and 208 thereby correctly latching the value of DIN onto the inverted node 220 as the SYNCOUTB signal. In this case, S and SB transition to a "stable" state which is defined as when S and SB are in opposite logic states and neither is in an intermediate voltage range (i.e., one signal is clearly in the high state voltage range while the other is clearly in the low state voltage range). While CLK is low (and CLKB is high), the master latch 221 is transparent so that the SYNCOUTB signal is passed to the input of the slave latch 223. When CLK next goes high, the master latch 221 latches the value of SYNCOUTB while the slave latch 223 becomes transparent, so that the value of the SYNCOUTB signal is effectively registered (and inverted) as the synchronized output signal DS by the register 222.

When DIN transitions from one state to another, then both DD and DB transition to opposite states. An attempt to latch DD and DB as S and SB, respectively, while transitioning may result in a metastable condition in which S and SB are latched to the same logic state or at least one of the S and SB signals is in the intermediate voltage range such that its logic state is invalid or undefined. The data synchronizer 104, however, operates to detect the metastable condition and delay completely closing the pass gates 204 and 208 until the S and SB signals resolve to the correct logic states. In particular, when CLK goes low while S and SB are in the same state or at least one of S and SB is in the indeterminate state, at least one of the gate controllers 224 and 230 detects the metastable condition and holds the pass gates 204 and 208 at least partially open and the cross-coupled inverters 212 and 214 tend to push S and SB to opposite logic states.

While the pass gates 204 and 208 are open or at least partially open, leakage current from DD and DB tend to drive S and SB to the correct states. After both of the signals S and SB finally settle to opposite states ending the metastable condition, then both PPASS and NPASS fully transition to finally close both of the pass gates 204 and 208 to thereby capture the correct logic values as the S and SB signals. It is appreciated that the metastable condition is a dynamic situation in that the S and SB signals may be transitioning in either direction. Nonetheless, it is instructive to consider each of multiple different static conditions and the resulting response of the data synchronizer 104 to resolve metastability into the correct stable condition to achieve the desired result.

During the metastable condition, if both S and SB are in a logic high state, then the gate controller 224 holds P1 and P2 on while the logic circuit 208 turns N1 and N2 off. Although N1 and N2 are off, since P1 and P2 are on, the pass gates 204 and 208 are both at least sufficiently open or on so that DD and DB continue to drive S and SB to the proper states. Similarly, if one of S and SB is high and the other is in the intermediate voltage range yet near the high voltage threshold, then P1 and P2 are still "mostly" on so that the pass gates 204 and 208 are both still at least sufficiently open so that S and SB are still driven relatively quickly to the proper states. If one of S and SB is high and the other is at or near the middle of the intermediate voltage range (e.g., VDD/2), then P1 and P1 are still "partly" on so that S and SB continue to be driven to the proper states. If one of S and SB is high while the other is in the intermediate voltage range yet near the low voltage threshold, then even if P1 and P2 are mostly off or even fully off, the cross-coupled inverters 212 and 214 force S and SB to opposite logic states.

It is appreciated that depending upon the particular transition, one of the S and SB signals may transition to its correct logic state faster than the other. Thus, when both S and SB are high, one is correctly high while the other must transition from high to low. The pass gates 204 and 208 are initially sufficiently open so that the influence of the DD and DB signals are sufficiently strong to initiate the transition. As the pass gates 204 and 208 continue to close so that the influence of the DD and DB signals weaken, the influence of the cross-coupled inverters 212 and 214 increases to complete the transition to the correct logic state.

The gate controller 230 operates in a similar manner. During the metastable condition, if both S and SB are in a logic low state, then the gate controller 224 turns P1 and P2 off while the logic circuit 208 holds N1 and N2 on. Although P1 and P2 are off, since N1 and N2 are on, the pass gates 204 and 208 are both at least sufficiently open or on so that DD and DB continue to drive S and SB to the proper states. Similarly, if one of S and SB is low and the other is in the intermediate voltage range yet near the low voltage threshold, then N1 and N2 are still "mostly" on so that the pass gates 204 and 208 are both still at least sufficiently open so that S and SB are still driven relatively quickly to the proper states. If one of S and SB is low and the other is at or near the middle of the intermediate voltage range (e.g., VDD/2), then N1 and N2 are still "partly" on so that S and SB continue to be driven to the proper states. If one of S and SB is low while the other is in the intermediate voltage range yet near the high voltage threshold, then even if N1 and N2 are mostly off or even fully off, the cross-coupled inverters 212 and 214 force S and SB to opposite logic states. Also, since one of the S and SB signals is correctly low and the other must transition from low to high, the pass gates 204 and 208 are initially sufficiently open so that the influence of the DD and DB signals are sufficiently strong to initiate the transition. As the pass gates 204 and 208 continue to close so that the influence of the DD and DB signals weaken, the influence of the cross-coupled inverters 212 and 214 increases to complete the transition to the correct logic state.

Operation is similar when S and SB are both in the intermediate voltage range so that both are in an indeterminate state. If both are near the high voltage threshold, then the gate controller 224 turns P1 and P2 mostly on so that DD and DB begin driving one of S and SB high and the other low. If both are near the low voltage threshold, then the gate controller 230 turns N1 and N2 mostly on so that DD and DB begin driving one of S and SB low and the other high. If S and SB are both at VDD/2 (i.e., in the middle of the full voltage range) such that both signals are equally indeterminate, this might otherwise be considered a stable situation that is not necessarily resolved by the cross-coupled inverters 212 and 214. In this case, the gate controllers 224 and 230 are both at least partially on so that both the P-channel and N-channel devices of both of the pass gates 204 and 208 are at least partially on. In this case, sufficient leakage current flows from DD and DB through the devices of the pass gates 204 and 208 to drive S and SB to the correct opposite states thereby closing the pass gates 204 and 208. Also, as S and SB separate, the influence of the cross-coupled inverters 212 and 214 increases to force S and SB to the proper states.

In a general case, the gate controller 224 keeps P1 and P2 at least partially on when the capture nodes 206 and 210 are at a high logic state or when at least one of the capture nodes 206 and 210 is in an intermediate voltage range and neither is in the low logic state. The gate controller 224 keeps P1 and P2 at least partially on when an average voltage of the capture nodes 206 and 210 is at least VDD/2 and neither is in a low logic state. In a similar manner, the gate controller 230 keeps N1 and N2 at least partially on when the capture nodes 206 and 210 are at a low logic state or when at least one of the capture nodes 206 and 210 is in an intermediate voltage range and neither is in the high logic state. The gate controller 230 keeps N1 and N2 at least partially on when an average voltage of the capture nodes 206 and 210 is no more than VDD/2 and neither is in a high logic state.

When CLK initially goes low during metastability in which the value of SYNCOUTB may be invalid or incorrect, the master latch 221 is transparent so that SYNCOUTB is provided to the input of the slave latch 223. The metastable condition terminates well before the next rising edge of CLK. Thus, S and SB have sufficient time to settle to the correct values and the pass gates 204 and 208 are then fully closed to effectively capture the correct value of S and SYNCOUTB. When CLK next rises, then the master latch 221 closes and the slave latch 223 opens and the correct value of SYNCOUTB is registered (and inverted) to the output as the synchronized data signal DS.

In an alternative configuration, SBB may be coupled to the input of the register 222 instead of SYNCOUTB in which case DS is an inverted and synchronized version of DIN. Also, both SYNCOUTB and SBB may be registered. Furthermore, the inversion at the output of the register 222 may be removed or else further inverted again to remove the logic inversion.

Figure 3:
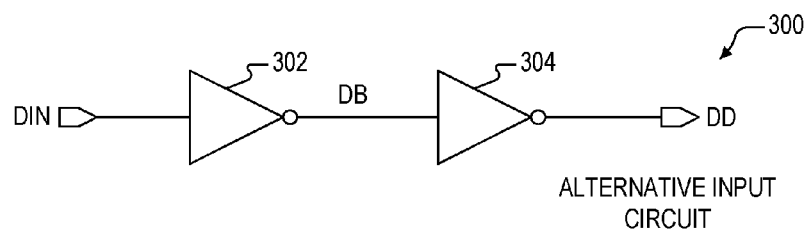
FIG. 3 is a schematic diagram of an input circuit that may be used to replace the input circuit of FIG. 2 according to an alternative embodiment.

FIG. 3 is a schematic diagram of an input circuit 300 that may be used to replace the input circuit 202 of FIG. 2 according to an alternative embodiment. The input circuit 300 illustrates a very simple alternative including a first inverter 302 that inverts DIN to provide DB, and a second inverter 304 that inverts DB to provide DD. The advantages of the input circuit 300 are reduced cost and size as compared to the input circuit 202. The input circuit 300 does insert a minimal delay between DB and DD, which is inconsequential in most practical configurations. The input circuit 202, or any other transition synchronizing circuit, may be used in any configurations in which it is desired that DB and DD transition at the same time or at least more closely to each other.

Figure 4:
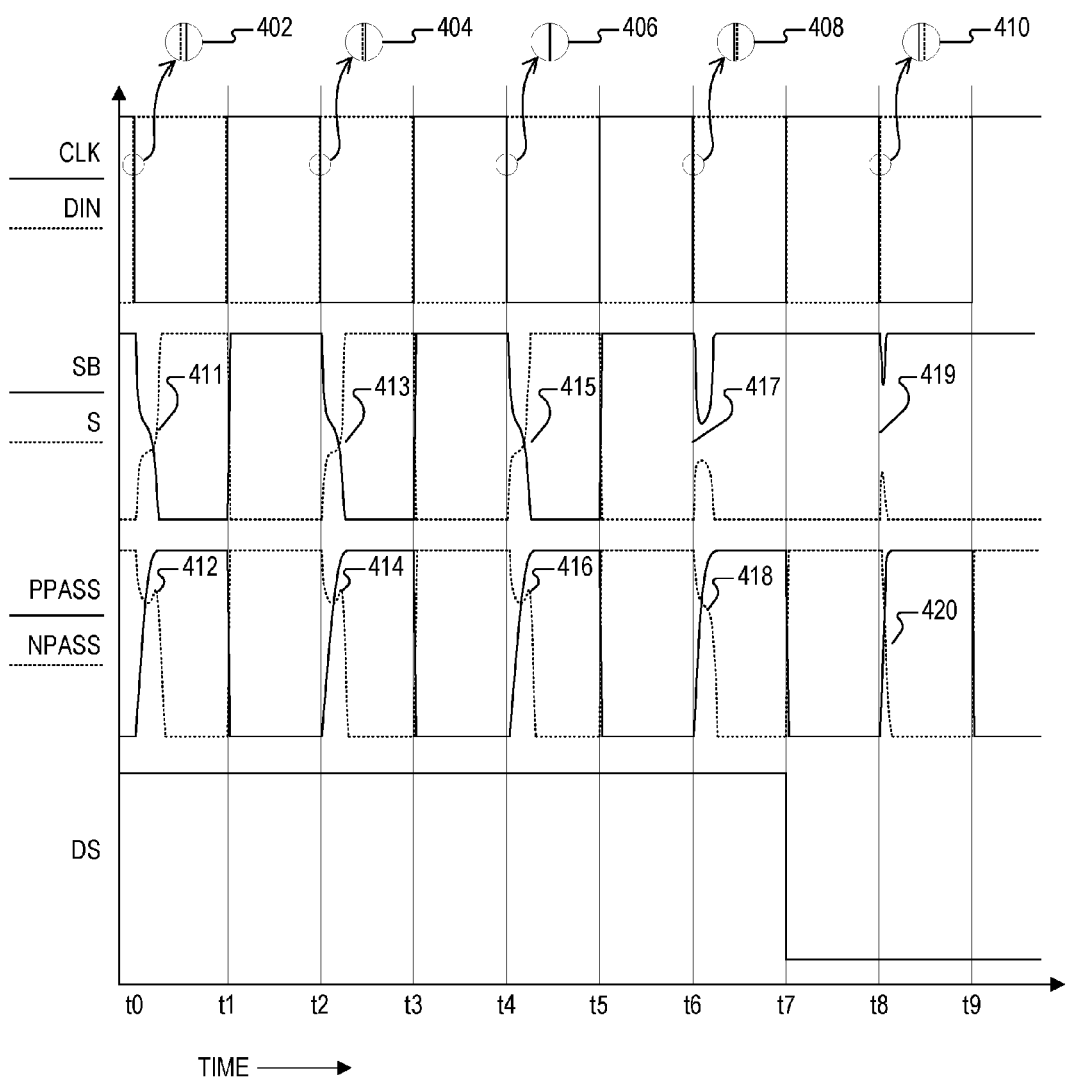
FIG. 4 is a timing diagram illustrating operation of the data synchronizer of FIG. 1 according to one embodiment of the present invention.

FIG. 4 is a timing diagram illustrating operation of the data synchronizer 104 according to one embodiment of the present invention. The signals CLK, DIN, SB, S, PPASS, NPASS and DS are plotted versus time. In the timing diagram, the signals CLK and DIN are superimposed with each other, the signals SB and S are superimposed with each other, and the signals PPASS and NPASS are superimposed with each other. The CLK, SB, and PPASS signals (and the DS signal) are plotted using a solid line whereas the DIN, S, and NPASS signals are plotted with a dotted line to distinguish signal states and transitions. The CLK and DIN signals include skew and transitions delays, although such delays are not readily discernible in the diagrams.

The DIN signal is shown transitioning substantially at the same times as the CLK signal except 180 degrees out of phase. In this manner, at least during the period shown, when the clock signal goes low, the DIN signal goes high and vice-versa. The period of DIN is incrementally increased each cycle by very small amount relative to the constant frequency CLK signal in order to provoke metastability. As shown in the timing diagram of FIG. 4, CLK transitions from high to low at times t0, t2, t4, t6, t8, etc., and transitions back high at intermediate times t1, t3, t5, t7, t9, etc. The DIN signal transitions to opposite states at about the same times, in which DIN transitions from low to high at about times t0, t2, t4, t6, and t8, and transitions back low at times t1, t3, t5, t7 and t9.

At time t0, DIN goes high just before CLK goes low even though the transitions are close to each other. A magnification 402 more clearly shows a separation between the transitions. Again at time t2, DIN goes high just before CLK goes low. A magnification 404 shows that the transitions are slightly closer to each other as compared to the magnification 402 since the period of DIN has been incrementally increased. At time t4, DIN goes high while CLK goes low, in which a magnification 406 shows that the relative transitions between CLK and DIN are almost simultaneous. At time t6, a magnification 408 illustrates that DIN now goes high just after CLK goes low. At time t8, a magnification 410 illustrates that DIN goes high after CLK goes low in which the separation in time becomes more pronounced.

It is noted that the illustration shown in FIG. 4 is simplified in that the relative increase of the period of DIN relative to CLK is significantly amplified and accelerated. In the actual configuration used to provoke metastability, the amount of increase of the period of DIN in sequential cycles is infinitesimal (e.g., on the order of 10-21 seconds), which is much smaller than that shown. A plot showing the actual adjustments over time would require several thousands of cycles to pinpoint the worst case metastability. The adjustments of DIN that are shown in FIG. 4 are dramatically exaggerated and accelerated to more clearly show and describe the concept employed and the results of actual operation.

DS is shown initially high before time t0. DIN goes high just before CLK transitions low at time t0 as more clearly shown at 402. When CLK transitions low at time t0, S and SB are transitioning as shown at 411 in response to DIN, so that NPASS and PPASS are also transitioning as shown at 412. The pass gates 204 and 208 remain at least partially open during the period of transition and metastability until S and SB stabilize, so that NPASS and PPASS stabilize to close the pass gates 204 and 208 before time t1 when CLK transitions back high (and DIN transitions back low). Thus, S and SB are latched at their new values before time t1, so that SYNCOUTB is registered as DS at time t1 to reflect the latched value of S. Since S is detected latched high at time t1, SYNCOUTB is low and the register 222 registers DS high after time t1. In this case, DS remains high until the next cycle.

Operation is substantially similar for the next 2 cycles of CLK. DIN goes high just before CLK transitions low at time t2 as more clearly shown at 404, although the transition is closer given the incremental increase of the period of DIN. When CLK transitions low at time t2, S and SB are transitioning as shown at 413, so that NPASS and PPASS are also transitioning as shown at 414. The pass gates 204 and 208 remain at least partially open during the period of transition and metastability until S and SB stabilize, so that NPASS and PPASS stabilize to close the pass gates 204 and 208 before time t3 when CLK transitions back high (and DIN transitions back low). At time t4, DIN goes high at about the same time as CLK transitions low as more clearly shown at 406. When CLK transitions low at time t4, S and SB are transitioning as shown at 415, so that NPASS and PPASS are also transitioning as shown at 416. Again, the pass gates 204 and 208 remain at least partially open during the period of transition and metastability until S and SB stabilize, so that NPASS and PPASS stabilize to close the pass gates 204 and 208 before time t5 when CLK transitions back high (and DIN transitions back low). In each of these two cycles, S is latched high and SB is latched low, so that the registered value of DS remains high.

In a subsequent cycle, DIN goes high after CLK transitions low at time t6 as more clearly shown at 408. When CLK transitions low at time t6, S and SB are transitioning as shown at 417, so that NPASS and PPASS are also transitioning as shown at 418. Again, the pass gates 204 and 208 remain at least partially open during the period of transition and metastability until S and SB stabilize, so that NPASS and PPASS stabilize to close the pass gates 204 and 208 before time t7 when CLK transitions back high (and DIN transitions back low). In this case, however, SB begins transitioning low but goes back high, while S begins transitioning high but goes back low. Thus, when the pass gates 204 and 208 finally close, S is latched low while SB is latched high. In this case, when CLK transitions back high at time t7, DS is registered low clearly reflecting the fact that S was latched low prior to time t7. Operation of the gate controllers 224 and 230 to keep the pass gates 204 and 208 at least partially opened during the metastable condition of S and SB enable detection and latching of the correct values of S and SB so that DS is properly latched to reflect the value of DIN.

As the period of DIN continues to be incrementally increased so that it goes high after slightly longer delay when CLK transitions low as more clearly shown at 410 at subsequent time t8, DS remains registered low. When CLK transitions low at time t8, S and SB begin to transition as shown at 419, while NPASS and PPASS are also transitioning as shown at 420. As the transition of DIN moves further in time away from the transition of CLK, the transitioning of S and SB and NPASS and PPASS become less pronounced while metastability is reduced.

In summary, when DIN transitions from low to high very close to the falling edge of CLK causing metastability of S and SB, the gate controllers 224 and 230 detect the metastable condition and hold the pass gates 204 and 208 at least partially open until S and SB settle to their correct logic states. After S and SB settle, the gate controllers 224 and 230 close the pass gates 204 and 208 to latch the state of S and SYNCOUTB, which is then registered as the synchronized output DS. Although not explicitly shown, when DIN transitions in the opposite direction from high to low very close to the falling edge of CLK causing metastability of S and SB, operation is substantially similar. In general, at least one of the gate controllers 224 and 230 detect the metastable condition during the operative edge of the clock and hold the pass gates 204 and 208 at least partially open until the metastable condition is resolved, at which time the pass gates 204 and 208 are closed to latch the correct logic state.

Figure 5:
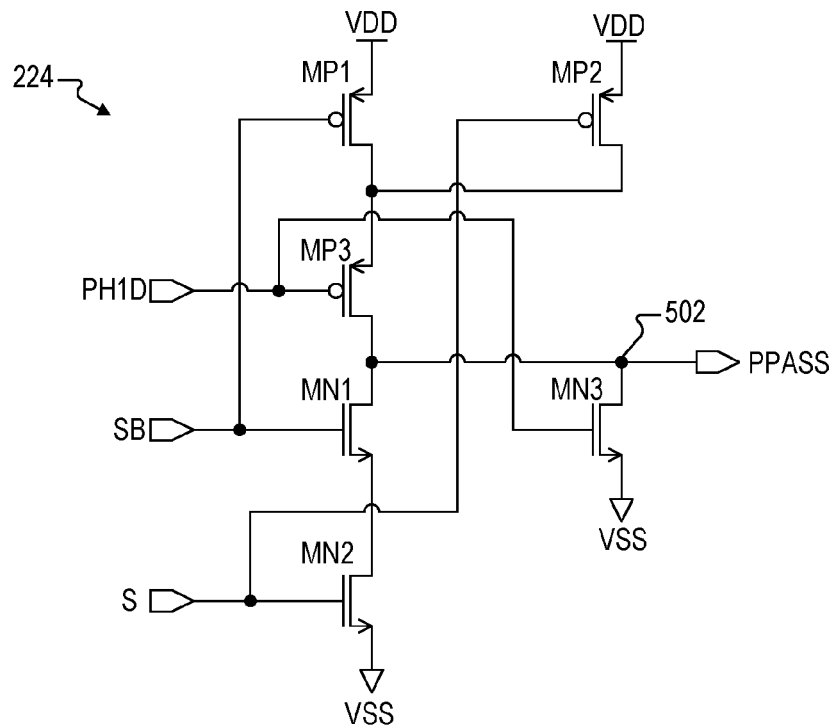
FIG. 5 is a schematic diagram of the upper logic gate of FIG. 2 providing PPASS according to one embodiment.

FIG. 5 is a schematic diagram of the gate controller 224 according to one embodiment. The gate controller 224 includes P-channel devices MP1, MP2 and MP3 and N-channel devices MN1, MN2 and MN3. The devices MP1-MP3 and MN1-MN3 may be implemented as FET or MOS type transistor devices including FinFET devices, in which the current terminals may be source and drain terminals and the control terminals may be gate terminals. SB is provided to the control terminals (e.g., gates) of MN1 and MP1, S is provided to the control terminals (e.g., gates) of MN2 and MP2, and PH1D is provided to the control terminals (e.g., gates) of MP3 and MN3. A first current terminal (e.g., source) of each of MP1 and MP2 is coupled to VDD, and a second current terminal (e.g., drain) of MP1 and MP2 are coupled together and to a first current terminal (e.g., source) of MP3. The second current terminal (e.g., drain) of MP3 is coupled to an output node 502 providing PPASS. Node 502 is further coupled to first current terminals (e.g., drains) of each of MN1 and MN3. The second current terminal (e.g., source) of MN1 is coupled to a first terminal (e.g., drain) of MN2 and the second current terminals (e.g., sources) of MN2 and MN3 are coupled to VSS.

As noted above, PH1D follows CLK after a small delay through the inverters 242 and 244. When PH1D is high, MN3 pulls PPASS low turning on P1 and P2 of the pass gates 204 and 208. When PH1D goes low, MN3 is turned off but MP3 is turned on. If S and SB are both high when PH1D goes low, PPASS remains pulled low via MN1 and MN2. If either S or SB is low when PH1D goes low, then at least one of MN1 and MN2 is turned off and at least one of MP1 and MP2 is turned on to pull PPASS high turning off P1 and P2 of the pass gates 204 and 208. If one of S and SB is high and the other is in the intermediate state (neither high nor low), then a current path exists through MN1 and MN2 tending to pull PPASS low, although another current path exists through MP3 tending to pull PPASS high. Also, if both S and SB are in their intermediate states, then the P-channel devices contend with the N-channel devices so that PPASS may not be pulled fully high. The actual level of PPASS depends the relative level(s) of the device(s) in the intermediate state, yet so long as PPASS is not pulled fully high, P1 and P2 remain at least partly on to allow current to flow from DD and DB to S and SB, respectively.

As an example, suppose SB is high and S is indeterminate but near the high logic voltage threshold. In this case, MP1 is off and MN1 is on, while MP2 is mostly off and MN2 is mostly on, so that PPASS is pulled mostly low and P1 and P2 are mostly on and so that the pass gates 204 and 208 are at least partly open. As the voltage of S falls, MP2 turns on more and MN2 turns off more, so that the voltage of PPASS rises so that both P1 and P2 begin turning off more. As the voltage difference between S and SB increases, the pass gates 204 and 208 are turned off more; yet the influence of the cross-coupled inverters 212 and 214 increases to force S and SB into their correct logic states. Even when S and SB are both in their intermediate states, such as each about VDD/2, then PPASS is not pulled fully high and P1 and P2 remain partially on so that currents through the pass gates 204 and 208 continue to influence S and SB to transition into their correct logic states.

Figure 6:
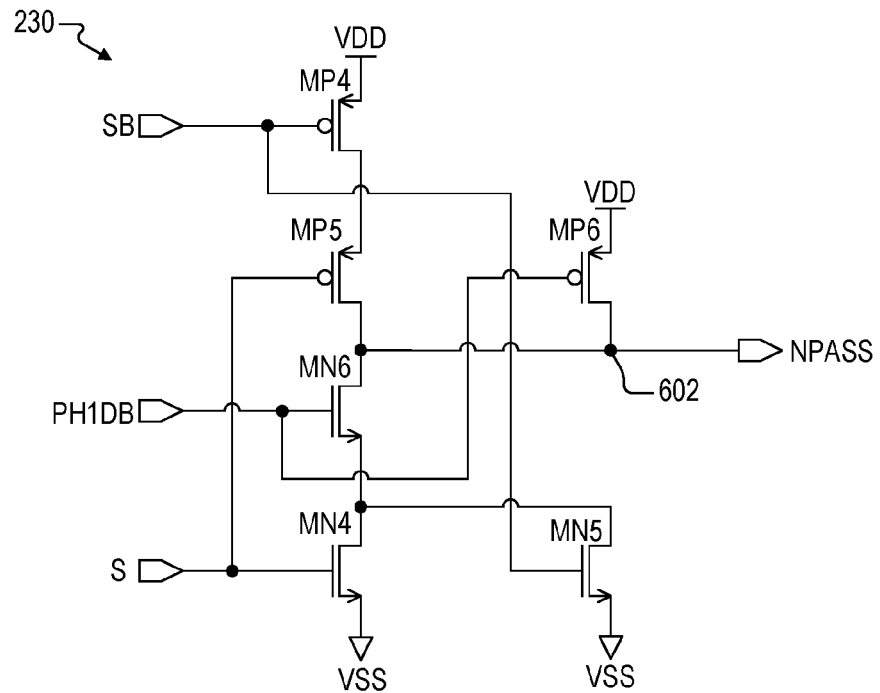
FIG. 6 is a schematic diagram of the lower logic gate of FIG. 2 providing NPASS according to one embodiment.

FIG. 6 is a schematic diagram of the gate controller 230 according to one embodiment. The gate controller 230 includes P-channel devices MP4, MP5 and MP6 and N-channel devices MN4, MN5 and MN6. The devices MP4-MP6 and MN4-MN6 may be implemented as FET or MOS type transistor devices including FinFET devices, in which the current terminals may be source and drain terminals and the control terminals may be gate terminals. SB is provided to the control terminals (e.g., gates) of MP4 and MN5, S is provided to the control terminals (e.g., gates) of MN4 and MP5, and PH1DB is provided to the control terminals (e.g., gates) of MN6 and MP6. A first current terminal (e.g., source) of each of MP4 and MP6 is coupled to VDD, and a first current terminal (e.g., source) of each of MN4 and MN5 is coupled to VSS. The second current terminal (e.g., drain) of MP4 is coupled to a first current terminal (e.g., source) of MP5. A second current terminal (e.g., drain) of each of MP5 and MP6 are coupled together at an output node 602 providing NPASS. A first current terminal (e.g., drain) of MN6 is coupled to node 602. The second current terminal (e.g., source) of MN6 is coupled to the second current terminals (e.g., drains) of MN4 and MN5.

As noted above, PH1DB is an inverted version of PH1D after a small delay through the inverter 246. When PH1DB is low, MP6 pulls NPASS high turning on N1 and N2 of the pass gates 204 and 208. When PH1DB goes high, MP6 is turned off but MN6 is turned on. If S and SB are both low when PH1DB goes high, NPASS remains pulled high via MP4 and MP5. If either S or SB is high when PH1DB goes high, then at least one of MN4 and MN5 is turned on and at least one of MP4 and MP5 is turned off to pull NPASS low turning off N1 and N2 of the pass gates 204 and 208. If one of S and SB is low and the other is in the intermediate state (neither high nor low), then a current path exists through MP4 and MP5 tending to pull NPASS high, although another current path exists through MN6 tending to pull NPASS low. Also, if both S and SB are in their intermediate states, then the P-channel devices contend with the N-channel devices so that NPASS may not be pulled fully low. The actual level of NPASS depends the relative level(s) of the device(s) in the intermediate state, yet so long as NPASS is not pulled fully low, N1 and N2 remain at least partly on to allow current to flow from DD and DB to S and SB, respectively.

As an example, suppose SB is low and S is indeterminate but near the low logic voltage threshold. In this case, MN5 is off and MP4 is on, while MN4 is mostly off and MP5 is mostly on, so that NPASS is pulled mostly high and N1 and N2 are mostly on and so that the pass gates 204 and 208 are at least partly open. As the voltage of S rises, MN4 turns on more and MP5 turns off more, so that the voltage of NPASS falls so that both N1 and N2 begin turning off more. As the voltage difference between S and SB increases, the pass gates 204 and 208 are turned off more; yet the influence of the cross-coupled inverters 212 and 214 increases to force S and SB into their correct logic states. Even when S and SB are both in their intermediate states, such as each about VDD/2, then NPASS is not pulled fully low and N1 and N2 remain partially on so that currents through the pass gates 204 and 208 continue to influence S and SB to transition into their correct logic states.

The foregoing description has been presented to enable one of ordinary skill in the art to make and use the present invention as provided within the context of a particular application and its requirements. Although the present invention has been described in considerable detail with reference to certain preferred versions thereof, other versions and variations are possible and contemplated. Various modifications to the preferred embodiments will be apparent to one skilled in the art, and the general principles defined herein may be applied to other embodiments. For example, the circuits described herein may be implemented in any suitable manner including logic devices or circuitry or the like.

Those skilled in the art should appreciate that they can readily use the disclosed conception and specific embodiments as a basis for designing or modifying other structures for carrying out the same purposes of the present invention without departing from the spirit and scope of the invention. Therefore, the present invention is not intended to be limited to the particular embodiments shown and described herein, but is to be accorded the widest scope consistent with the principles and novel features herein disclosed.

What is claimed is:

1. A data synchronizer that registers an input data signal into a clock domain of a clock signal, comprising:
    an input circuit having an input for receiving the input data signal, having a first output coupled to a first data node and a second output coupled to a second data node, wherein said first and second data nodes are driven to opposite logic states;
    a first pass gate having current terminals coupled between said first data node and a first capture node and having positive and negative control terminals;
    a second pass gate having current terminals coupled between said second data node and a second capture node and having positive and negative control terminals;
    first and second inverters that are cross-coupled between said first and second capture nodes;
    a gate controller responsive to the clock signal, having inputs coupled to said first and second capture nodes and outputs coupled to said positive and negative control terminals of said first and second pass gates, wherein said gate controller is capable of keeping said first and second pass gates at least partially open during a metastable condition of said first and second capture nodes, and is capable of closing said first and second pass gates when said first and second capture nodes resolve to opposite logic states; and
    a register that registers at least one of said first and second capture nodes to provide a registered data output in response to the clock signal.

2. The data synchronizer of claim 1, wherein said first and second pass gates each comprise a P-channel device having current terminals coupled in parallel with current terminals of an N-channel device and coupled between a corresponding one of said first and second data nodes and a corresponding one of said first and second capture nodes, wherein said P-channel device includes a control node coupled to said positive control node of a corresponding one of said first and second pass gates, and wherein said N-channel device includes a control node coupled to said negative control node of a corresponding one of said first and second pass gates.

3. The data synchronizer of claim 1, wherein said gate controller comprises:
    an AND-OR-Invert gate having a first input coupled to said first capture node, having a second input coupled to said second capture node, having a third input responsive to the clock signal, and having an output coupled to said positive control terminal of said first and second pass gates; and
    an OR-AND-Invert gate having a first input coupled to said first capture node, having a second input coupled to said second capture node, having a third input responsive to the clock signal, and having an output coupled to said negative control terminal of said first and second pass gates.

4. The data synchronizer of claim 3, further comprising a clock circuit comprising:
    a first inverter having an input for receiving the clock signal and having an output providing an inverted clock signal;
    a second inverter having an input receiving said inverted clock signal and having an output providing a first clock signal provided to said third input of said AND-OR-Invert gate; and
    a third inverter having an input receiving said first clock signal and having an output providing a second clock signal provided to said third input of said OR-AND-Invert gate.

5. The data synchronizer of claim 4, wherein:
    said AND-OR-Invert gate performs a logic AND logic function of said first and second capture nodes to provide a first gate control signal and performs a logic NOR function of said first gate control signal and said first clock signal to provide a positive gate signal provided to said positive control terminal of said first and second pass gates; and
    wherein said OR-AND-Invert gate performs a logic OR logic function of said first and second capture nodes to provide a second gate control signal and performs a logic NAND function of said second gate control signal and said second clock signal to provide a negative gate signal provided to said negative control terminal of said first and second pass gates.

6. The data synchronizer of claim 1, wherein:
    said first pass gate comprises a first P-channel device having first and second current terminals coupled between said first input data node and said first capture node, and having a control terminal coupled to said positive control terminal of said first pass gate;
    wherein said second pass gate comprises a second P-channel device having first and second current terminals coupled between said second input data node and said second capture node, and having a control terminal coupled to said positive control terminal of said second pass gate; and
    wherein said gate controller is capable of keeping said first and second P-channel devices at least partially on when one of said first and second capture nodes is within a logic high voltage range while the other one of said first and second capture nodes is in an intermediate voltage range between said logic high voltage range and a logic low voltage range.

7. The data synchronizer of claim 6, wherein said gate controller is capable of keeping said first and second P-channel devices at least partially on when an average voltage of said first and second capture nodes is at least a middle voltage level of a full logic voltage range and neither is within said logic low voltage range.

8. The data synchronizer of claim 1, wherein:
said first pass gate comprises a first N-channel device having first and second current terminals coupled between said first input data node and said first capture node and having a control terminal coupled to said negative control terminal of said first pass gate;
wherein said second pass gate comprises a second N-channel device having first and second current terminals coupled between said second input data node and said second capture node and having a control terminal coupled to said negative control terminal of said second pass gate; and
wherein said gate controller is capable of keeping said first and second N-channel devices at least partially on when one of said first and second capture nodes is within a logic low voltage range while the other one of said first and second capture nodes is in an intermediate voltage range between a logic high voltage range and said logic low voltage range.

9. The data synchronizer of claim 8, wherein said gate controller is capable of keeping said first and second N-channel devices at least partially on when an average voltage of said first and second capture nodes is no more than a middle voltage level of a full logic voltage range and neither is within said logic high voltage range.

10. The data synchronizer of claim 1, wherein said input circuit comprises:
a data inverter having an input for receiving the input data signal and having an output providing an inverted data signal;
a first multiplexer having a first select input for receiving the input data signal, a second select input receiving said inverted data signal, first and second inputs receiving first and second supply voltages, and an output coupled to said first data node; and
a second multiplexer having a first select input for receiving the input data signal, a second select input receiving said inverted data signal, first and second inputs receiving first and second supply voltages, and an output coupled to said second data node.

11. The data synchronizer of claim 1, further comprising buffering logic that provides substantially balanced loading to said first and second capture nodes and that provides a buffered output to an input of said register.

12. The data synchronizer of claim 1, wherein said input circuit, said first and second pass gates, said first and second inverters, and said gate controller are implemented using FinFET devices.

13. A method of synchronizing an input data signal with a clock signal, comprising:
providing first and second data signals that transition to opposite logic states in response to transitions of the input data signal;
passing the first data signal through a first pass gate to a first capture node;
passing the second data signal through a second pass gate to a second capture node;
in response to an operative transition of the clock signal for latching the first and second capture nodes:
keeping the first and second pass gates at least partially open during a metastable condition of the first and second capture nodes; and
closing the first and second pass gates to latch the capture nodes when the first and second capture nodes settle to opposite logic states; and
registering at least one of the first and second capture nodes in response to the clock signal to provide a registered data signal that is synchronous with the clock signal.

14. The method of claim 13, wherein said keeping the first and second pass gates at least partially open during the metastable condition comprises keeping the first and second pass gates at least partially open when the first and second capture nodes are at the same logic state or when at least one of the first and second capture nodes is in an intermediate voltage range rendering its logic state indeterminate.

15. The method of claim 13, wherein said keeping the first and second pass gates at least partially open during the metastable condition comprises providing a positive gate signal that controls a P-channel device of each of the first and second pass gates to remain at least partially on when the first and second capture nodes are in a logic high state or when at least one of the first and second capture nodes is in an intermediate voltage range and neither is in a low logic state.

16. The method of claim 13, wherein said keeping the first and second pass gates at least partially open during the metastable condition comprises providing a positive gate signal that controls a P-channel device of each of the first and second pass gates to remain at least partially on when an average voltage of the first and second capture nodes is at least a middle voltage level of a full logic voltage range and neither is in a low logic state.

17. The method of claim 13, wherein said keeping the first and second pass gates at least partially open during the metastable condition comprises providing a negative gate signal that controls an N-channel device of each of the first and second pass gates to remain at least partially on when the first and second capture nodes are in a logic low state or when at least one of the first and second capture nodes is in an intermediate voltage range and neither is in a high logic state.

18. The method of claim 13, wherein said keeping the first and second pass gates at least partially open during the metastable condition comprises providing a negative gate signal that controls an N-channel device of each of the first and second pass gates to remain at least partially on when an average voltage of the first and second capture nodes is no more than a middle voltage level of a full logic voltage range and neither is in a high logic state.

19. The method of claim 13, further comprising loading the first and second capture nodes in a substantially balanced manner.

20. The method of claim 13, wherein said registering at least one of the first and second capture nodes comprises:
buffering one of the first and second capture nodes to provide a buffered node; and
registering the buffered node in response to the clock signal to provide a registered data signal that is synchronous with the clock signal.

21. The method of claim 20, wherein said buffering one of the first and second capture nodes to provide a buffered node includes inverting a state of a capture node to provide the buffered node.

* * * * *